US010529587B2

United States Patent
Sato et al.

(10) Patent No.: US 10,529,587 B2
(45) Date of Patent: Jan. 7, 2020

(54) SEMICONDUCTOR DEVICE AND METHOD OF MANUFACTURING SEMICONDUCTOR DEVICE

(71) Applicant: Mitsubishi Electric Corporation, Chiyoda-ku (JP)

(72) Inventors: Yuji Sato, Chiyoda-ku (JP); Motoru Yoshida, Chiyoda-ku (JP); Jun Fujita, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/098,517

(22) PCT Filed: May 15, 2017

(86) PCT No.: PCT/JP2017/018134
§ 371 (c)(1),
(2) Date: Nov. 2, 2018

(87) PCT Pub. No.: WO2017/212873
PCT Pub. Date: Dec. 14, 2017

(65) Prior Publication Data
US 2019/0148163 A1 May 16, 2019

(30) Foreign Application Priority Data
Jun. 10, 2016 (JP) .................. 2016-116114

(51) Int. Cl.
*H01L 21/32* (2006.01)
*H01L 29/78* (2006.01)
(Continued)

(52) U.S. Cl.
CPC .. *H01L 21/32051* (2013.01); *H01L 21/31116* (2013.01); *H01L 21/3205* (2013.01);
(Continued)

(58) Field of Classification Search
CPC ... H01L 21/32; H01L 21/32051; H01L 29/78; H01L 21/768
(Continued)

(56) References Cited

U.S. PATENT DOCUMENTS

| 4,351,894 A | 9/1982 | Yonezawa et al. |
| 2002/0003048 A1 | 1/2002 | Chikama et al. |
| 2005/0104068 A1 | 5/2005 | Yamazaki |

FOREIGN PATENT DOCUMENTS

| JP | 53-53280 | 5/1978 |
| JP | 3-11738 A | 1/1991 |

(Continued)

OTHER PUBLICATIONS

International Search Report dated Jun. 20, 2017, in PCT/JP2017/018134 filed May 15, 2017.
(Continued)

*Primary Examiner* — Fazli Erdem
(74) *Attorney, Agent, or Firm* — Oblon, McClelland, Maier & Neustadt, L.L.P.

(57) ABSTRACT

A semiconductor device includes a semiconductor substrate, an insulating film, and an electrode. The semiconductor substrate includes a first surface. The insulating film is provided on the first surface of the semiconductor substrate and includes a second surface opposite to the first surface. The electrode is connected to the second surface of the insulating film and includes a side surface, a first face in contact with the insulating film, and a second face opposite to the first face. An outer periphery of the second face of the electrode is formed on an inner side of an outer periphery of the first face.

9 Claims, 10 Drawing Sheets

(51) Int. Cl.
*H01L 21/3205* (2006.01)
*H01L 23/522* (2006.01)
*H01L 21/768* (2006.01)
*H01L 21/311* (2006.01)

(52) U.S. Cl.
CPC ...... *H01L 21/768* (2013.01); *H01L 21/76801* (2013.01); *H01L 23/522* (2013.01); *H01L 29/78* (2013.01)

(58) Field of Classification Search
USPC .......................................................... 257/288
See application file for complete search history.

(56) References Cited

FOREIGN PATENT DOCUMENTS

| | | | |
|---|---|---|---|
| JP | 2001-308323 | A | 11/2001 |
| JP | 2002-50627 | A | 2/2002 |
| JP | 2002-134510 | A | 5/2002 |
| JP | 2004-79797 | A | 3/2004 |
| JP | 2004-297075 | A | 10/2004 |
| JP | 2012-243984 | A | 12/2012 |
| JP | 2015-185783 | A | 10/2015 |

OTHER PUBLICATIONS

Japanese Office Action (Notification of Reasons for Refusal) dated Feb. 1, 2018, in corresponding Japan Patent Application No. JP 2017-559723 filed Dec. 14, 2017 (with an English translation).

SEMICONDUCTOR DEVICE AND METHOD OF MANUFACTURING SEMICONDUCTOR DEVICE

TECHNICAL FIELD

The present invention relates to a semiconductor device and a method of manufacturing a semiconductor device.

BACKGROUND ART

In order to construct a semiconductor device, a plurality of types of materials should be stacked. For example, an insulating film such as an oxide film is formed on a semiconductor substrate, and an electrode such as a copper (Cu) film is stacked on the insulating film. With increase in temperature of the insulating film and the electrode, stress is produced at an interface between the insulating film and the electrode due to a difference in coefficient of linear expansion between the insulating film and the electrode. Load is applied to the insulating film due to the stress, which may break the insulating film. With increase in thickness of the electrode, stress produced at the interface between the insulating film and the electrode increases. Therefore, when the electrode increases in thickness, the insulating film is more likely to be broken by the stress.

For example, Japanese Patent Laying-Open No. 2015-185783 (PTL 1) describes a semiconductor device including a thick metal electrode. In this semiconductor device, the metal electrode includes a structure like stairs.

CITATION LIST

Patent Literature

PTL 1: Japanese Patent Laying-Open No. 2015-185783

SUMMARY OF INVENTION

Technical Problem

Since load applied by the stress is generally most concentrated in an insulating film at an outer peripheral edge (which will be referred to as a terminal portion below) in a region of an electrode connected to the insulating film, the terminal portion tends to be a starting point of break of the insulating film. In the semiconductor device described in the literature, the terminal portion of the metal electrode is smaller in thickness than a central portion of the metal electrode. Therefore, stress at the terminal portion which tends to be a starting point of break of the insulating film can be lowered.

A shape of a side surface of the electrode is also a factor for break. Specifically, as an angle formed between a side surface of the electrode and an upper surface of the insulating film is smaller, concentration of stress at the terminal portion is less likely, and as an angle formed between the side surface of the electrode and the upper surface of the insulating film is greater, concentration of stress at the terminal portion is more likely. In the semiconductor device described in the literature, the side surface of the metal electrode and the upper surface of the insulating film form substantially a right angle. Therefore, since concentration of stress at the terminal portion in the insulating film is likely, a structure of the metal electrode of the semiconductor device described in the literature is not sufficient as measures for lowering in stress. Even though the metal electrode includes the structure like stairs, a large thickness of a first stair in the stair structure lessens an effect of lowering in stress at the terminal portion of the metal electrode. Therefore, stress may be concentrated in the insulating film. Therefore, the stress could break the insulating film.

The present invention was made in view of the problem above, and an object thereof is to provide a semiconductor device capable of suppressing break of an insulating film due to stress produced at an interface between the insulating film and an electrode and a method of manufacturing a semiconductor device.

Solution to Problem

A semiconductor device according to the present invention includes a semiconductor substrate, an insulating film, and an electrode. The semiconductor substrate includes a first surface. The insulating film is provided on the first surface of the semiconductor substrate and includes a second surface opposite to the first surface. The electrode is connected to the second surface of the insulating film and includes a side surface, a first face in contact with the insulating film, and a second face opposite to the first face. An outer periphery of the second face of the electrode is formed on an inner side of an outer periphery of the first face.

Advantageous Effects of Invention

According to the semiconductor device in the present invention, the outer periphery of the second face of the electrode is formed on the inner side of the outer periphery of the first face. Therefore, stress at the edge which tends to be a starting point of break of the insulating film can be lowered. Since the electrode and the insulating film are connected to each other at a small angle, concentration of stress in the insulating film can be suppressed. Therefore, break of the insulating film due to the stress produced at the interface between the insulating film and the electrode can be suppressed.

DESCRIPTION OF EMBODIMENTS (First Embodiment)

Figure 1:
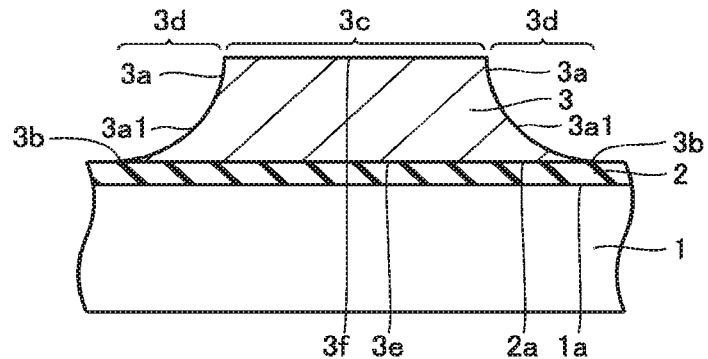
FIG. 1 is a cross-sectional view schematically showing a semiconductor device according to a first embodiment of the present invention.

A construction of a semiconductor device according to a first embodiment of the present invention will be described with reference to FIG. 1. FIG. 1 is a schematic diagram showing a cross-sectional shape of the semiconductor device in the first embodiment. The semiconductor device in the present embodiment includes a semiconductor substrate 1, an insulating film 2, and an electrode 3.

A semiconductor element (semiconductor device) is fabricated on semiconductor substrate 1. The semiconductor device includes such types as an insulated gate bipolar transistor (IGBT) and a metal oxide semiconductor field effect transistor (MOSFET). A material for semiconductor substrate 1 includes silicon (Si) and silicon carbide (SiC). A structure, a material, or a shape of a semiconductor device does not matter so long as an electrode shape in the present embodiment can be formed. Specifically, a structure of a semiconductor device may be a diode. A material for the semiconductor device may be gallium nitride (GaN). Semiconductor substrate 1 includes a first surface 1*a*.

Insulating film 2 is formed on semiconductor substrate 1. Specifically, insulating film 2 is provided on first surface 1*a* of semiconductor substrate 1. When a MOSFET is fabricated as a semiconductor device on semiconductor substrate 1, an insulating oxide film can be employed as insulating film 2. The insulating oxide film is arranged under electrode 3 (a metal film for an electrode). Any material may be adopted for the insulating oxide film so long as it is insulating, and for example, silicon dioxide ($SiO_2$) can be employed for the insulating oxide film. Insulating film 2 includes a second surface 2*a* opposite to first surface 1*a* of semiconductor substrate 1. The insulating oxide film does not have to uniformly or evenly be formed on semiconductor substrate 1, and there may be a region where no insulating oxide film is formed on a part of semiconductor substrate 1.

Electrode 3 is formed on insulating film 2. Specifically, electrode 3 is connected to second surface 2*a* of insulating film 2. For example, copper (Cu) represents an exemplary material for electrode (metal film for electrode) 3 formed on insulating film 2. Characteristics such as density, surface roughness, and electrical conductivity of copper (Cu) are not particularly limited.

Electrode 3 includes a side surface 3*a*, an edge 3*b*, a central portion 3*c*, a terminal portion 3*d*, a first face 3*e*, and a second face 3f. Side surface 3a is a surface arranged on a lateral side of electrode 3. Edge 3b is located at an outer end of side surface 3a.

Central portion 3c is surrounded by side surface 3a. Terminal portion 3d is arranged on an outer side of central portion 3c. In other words, central portion 3c is a portion surrounded by terminal portion 3d. First face 3e is connected to side surface 3a. First face 3e is connected to insulating film 2. Second face 3f is connected to side surface 3a. Second face 3f is located opposite to first face 3d. First face 3e and second face 3f are opposed to each other.

Side surface 3a of electrode 3 includes a curved portion 3a1. Curved portion 3a1 is curved as being recessed toward second surface 2a such that a thickness of electrode 3 decreases toward edge 3b where side surface 3a is connected to second surface 2a of insulating film 2. Curved portion 3a1 is in an arc shape in a cross-sectional view. Therefore, terminal portion 3d is in a shape of a fillet. This fillet shape is sloped. The slope is constructed such that an angle formed between side surface 3a and second surface 2a is smaller toward second surface 2a of insulating film 2. Side surface 3a of electrode 3 is thus connected as being sloped with respect to second surface 2a of insulating film 2. Side surface 3a of electrode 3 is not connected perpendicularly to second surface 2a of insulating film 2. Insulating film 2 does not have to uniformly or evenly be formed directly under terminal portion 3d of electrode 3. Insulating film 2 is not formed on a part directly under terminal portion 3d but semiconductor substrate 1 is exposed and in direct contact with electrode 3. There may be a region where semiconductor substrate 1 is in ohmic contact with electrode 3.

In a direction along second surface 2a of insulating film 2, first face 3e is longer than second face 3f. In other words, an upper side of electrode 3 is shorter than a lower side. Electrode 3 is projecting upward as a whole.

In the present embodiment, side surface 3a is constructed to be curved continuously from first face 3e to second face 3f. In the present embodiment, side surface 3a is constructed in an arc shape from first face 3e to second face 3f in the cross-sectional view. Side surface 3a does not have to uniformly be curved such that its entirety has a curvature but there may be a point of inflection at some intermediate position. Side surface 3a may include a linear portion in addition to curved portion 3a1.

Relation between a dimension of electrode 3 and an effect of lowering in stress in the present embodiment will be described with reference to FIGS. 1 to 5.

Referring to FIG. 1, by decreasing a thickness of terminal portion 3d of electrode 3, stress produced in insulating film 2 at terminal portion 3d of electrode 3 smaller in thickness is lowered. Generation of a crack in insulating film 2 at terminal portion 3d of electrode 3 is thus suppressed. For the purpose of calculation of a thickness of terminal portion 3d necessary for suppression of generation of a crack, an analytic model in which terminal portion 3d was decreased in thickness was prepared for analysis and experiments.

Specifically, the analytic model was prepared and analyzed in accordance with an actual module structure. Application of a certain thermal history was included in conditions of analysis as a precondition, and a value of stress applied to the analytic model after the thermal history was analyzed. It was confirmed in experiments that correlation between a thickness and an amount of crack was consistent with results of analysis when a thermal history the same as in analysis was applied to a sample having a structure as in the analytic model.

The thermal history from approximately 70° C. which was a temperature at the time of fabrication of a film to approximately 350° C. which was a highest temperature from fabrication of the film until completion of a chip was set as a condition for analysis, with approximately 70° C. being defined as a lower limit value and approximately 350° C. being defined as an upper limit value.

A specimen of 10 mm×10 mm was employed as a sample in the experiments. After a temperature in the experiments was held for one hour at 350° C. in vacuum from a room temperature, the temperature in the experiments was again set to the room temperature. A vacuum heat treatment furnace was employed as a heat treatment apparatus. A cross-sectional scanning electron microscope (SEM) was employed as an observation apparatus.

Consequently, it was found that an effect to suppress generation of a crack was obtained based on decrease in thickness and a shape of terminal portion 3d. Specifically, it was confirmed that generation of a crack could sufficiently be suppressed by setting a dimension of electrode 3 as follows. A distance in a direction along second surface 2a from a point where a thickness of side surface 3a from second surface 2a was ⅓ of a thickness thereof at central portion 3c to edge 3b is at least ten times as large as the thickness of side surface 3a at that point. A dimension of a fillet shape of terminal portion 3d of electrode 3 is such that a ratio between a longitudinal dimension (a height) and a lateral dimension (a width) of the fillet shape on a side of edge 3b of electrode 3 relative to a point in terminal portion 3d where a thickness is H/3, where H represents a thickness of electrode 3, is at least 1:10.

Figure 2:
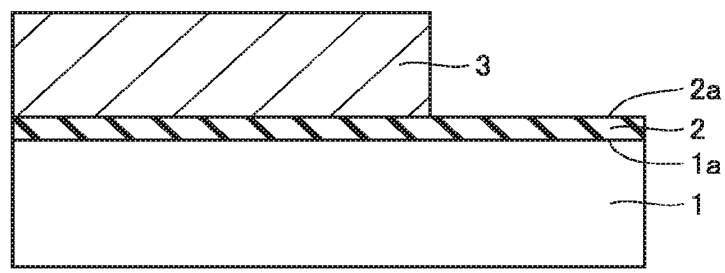
FIG. 2 is a schematic diagram of an analytic model of an electrode structure of the semiconductor device according to the first embodiment of the present invention.
Figure 3:
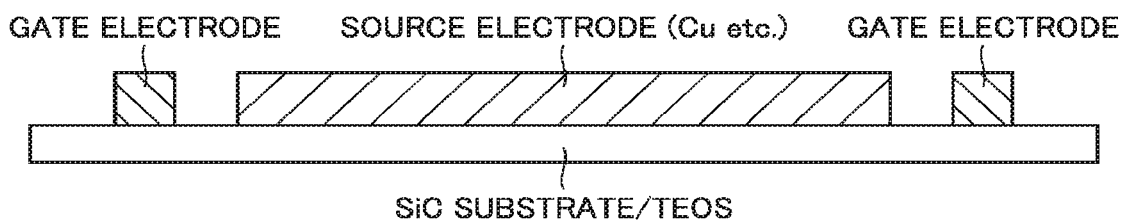
FIG. 3 is a structure diagram of a module used for analysis of the electrode structure of the semiconductor device according to the first embodiment of the present invention.

In succession, a result of verification of the effect of lowering in stress obtained by setting the fillet shape of terminal portion 3d to have the dimension above will be described. A shape of electrode 3 effective for lowering in stress was studied with reference to FIGS. 2 to 5. FIG. 2 is a schematic diagram of an analytic model used for studies of a shape of the terminal portion of electrode 3. FIG. 3 is a structure diagram of a module (chip) used for analysis. A chip having a similar structure was used also in experiments.

As shown in FIG. 3, an insulating oxide film (TEOS) is formed on an SiC substrate as the semiconductor substrate, and an electrode such as a patterned source electrode is formed on TEOS. An example in which both of SiC and Si were used for the semiconductor substrate was analyzed, and it was confirmed that correlation between a thickness of the electrode and variation in generated stress tended to be the same in both of SiC and Si examples.

In order to accurately simulate influence by a device structure to generated stress, a gate electrode was provided for analysis. In the experiments, presence or absence of a gate electrode did not contribute to generation of a crack in TEOS at an end portion of the source electrode. Therefore, any dimension of the gate electrode is applicable so long as the dimension is within a range satisfying a function as a gate and not affecting other module functions.

Initially, the effect of lowering in stress owing to decrease in thickness of the terminal portion of electrode 3 was verified. For simplification, single-layer electrode 3 without any fillet was provided. Three types of analytic models in which single-layered electrodes 3 had thicknesses of 30 μm, 10 μm, and 5 μm, respectively, were fabricated. The reference for setting a thickness of electrode 3 in the analytic model was determined in consideration of restrictions in a process for producing a device. The upper limit value of a thickness of electrode 3 to thus be studied was set to 30 μm. It is expected that stress generated at the terminal portion of electrode 3 is lower as a thickness of electrode 3 is smaller. Therefore, such a condition that a thickness of electrode 3 was decreased from 30 μm was set. Specifically, a thickness of electrode 3 was set to 10 μm or 5 μm. Table 1 shows results of analysis.

TABLE 1

| | Thickness | Stress Value (MPa) |
|---|---|---|
| 1 | 30 μm | A |
| 2 | 10 μm | 4A/5 |
| 3 | 5 μm | 3A/5 |

Referring to Table 1, stress applied to insulating film (insulating oxide film) 2 with which the terminal portion of electrode 3 was in contact when electrode 3 had a thickness of 30 μm was defined as a stress value A (MPa). Then, when electrode 3 had a thickness of 10 μm, stress applied to insulating oxide film 2 with which the terminal portion of electrode 3 was in contact was approximately 4A/5 (approximately 80% of A). When electrode 3 had a thickness of 5 μm, stress applied to insulating oxide film 2 at the terminal portion of electrode 3 was approximately 3A/5 (approximately 60% of A). Therefore, as electrode 3 is smaller in thickness, stress applied to insulating oxide film 2 with which the terminal portion of electrode 3 is in contact is lower. It was thus found that stress applied to insulating oxide film 2 could be lowered by decreasing a thickness of the terminal portion of electrode 3.

The results of analysis were verified through experiments. When electrode 3 had a thickness of 30 μm, a crack was generated in insulating oxide film 2 due to stress applied to insulating oxide film 2. When electrode 3 had a thickness not greater than 10 μm, no crack was generated in insulating oxide film 2. Therefore, it was found that, in order to suppress generation of a crack in insulating oxide film 2, electrode 3 should have a thickness not greater than 10 μm so that stress applied to insulating oxide film 2 was not higher than 4A/5.

As set forth above, it was found that stress was lower as a thickness of the terminal portion of electrode 3 was smaller. A thickness of several ten μm, however, is required as a thickness of electrode 3 in terms of restrictions in the process, and therefore decrease in thickness is limited. When the terminal portion of electrode 3 is formed perpendicularly to insulating oxide film 2, stress is concentrated in a portion of connection between the terminal portion of electrode 3 and insulating oxide film 2, and hence concentration of stress to the terminal portion of electrode 3 is inevitable. For further lowering in stress, such a shape as not allowing concentration of stress in the portion of connection between the terminal portion of electrode 3 and insulating oxide film 2 should be formed while a thickness of approximately several ten μm is secured as the thickness of electrode 3. Therefore, results of verification of an effect of fabrication of a fillet shape at the terminal portion of electrode 3 will be described.

For simplification, the analytic model is constructed to have two layers like stairs rather than such a shape as a fillet shape being attached to the terminal portion of the electrode. By comparing a value of stress applied to the insulating oxide film with which the terminal portion of a first-layer electrode was in contact, it was confirmed that the fillet shape was also effective to lower stress similarly to decrease in thickness.

Figure 4:
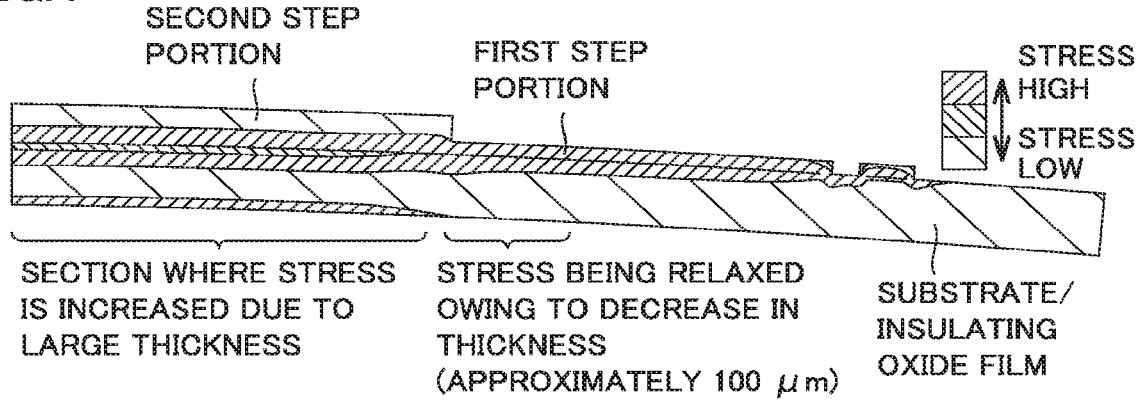
FIG. 4 is a diagram showing a result of analysis of an effect of lowering in stress of the electrode structure of the semiconductor device according to the first embodiment of the present invention.

FIG. 4 shows results of analysis. Referring to FIG. 4, as a result of analysis of stress in a film in the two-layered structure, large stress was applied also to an underlying insulating oxide film in a portion where a total thickness of the first layer (a first step portion) and a second layer (a second step portion) was 30 μm. In a portion where only the first-layer electrode was located but a second-layer electrode was not formed and the first-layer electrode had a thickness of 10 μm, stress applied to the insulating oxide film also decreased. It was found based on the results of analysis that stress generated in insulating oxide film 2 in a portion having a thickness of 30 μm where the second-layer electrode was formed was substantially relaxed at a point distant by approximately 100 μm from a point where the second-layer electrode was no longer present but the first-layer electrode alone was present. It was found that stress lowered as a distance from the end portion of the second-layer electrode was longer and that stress was substantially relaxed at a distance of 100 μm from the end portion of the second-layer electrode.

Figure 5:
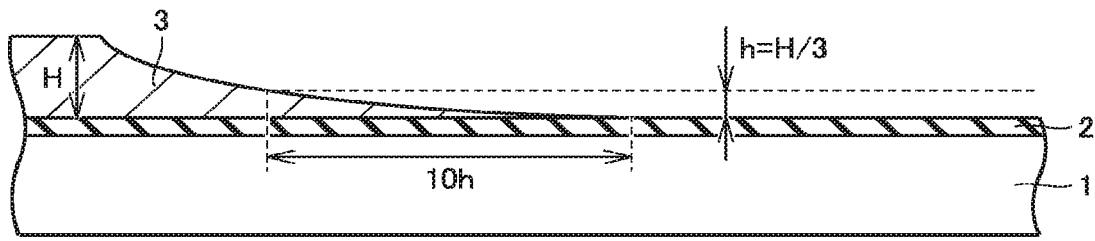
FIG. 5 is a schematic diagram for illustrating a dimension of the electrode structure of the semiconductor device according to the first embodiment of the present invention.

A dimension of electrode 3 is defined based on the above with reference to FIG. 5. An average thickness of a flat portion without being etched in an upper side of electrode 3 is denoted as H. A thickness H/3 which corresponds to ⅓ of H is denoted as h. A sufficient effect of stress relaxation is obtained by forming such a fillet shape that a point in the terminal portion of electrode 3 where a thickness is h is at a distance of 10h from the edge of electrode 3 (a dimension of the fillet shape at the point where a thickness is h is a longitudinal dimension: a lateral dimension=1:10 when the dimension is expressed as a ratio). Therefore, a dimension of the fillet shape is set such that a ratio of the fillet from the edge of electrode 3 on a side of the edge relative to the point of H/3 is set to the longitudinal dimension: the lateral dimension=1:10, where H represents a thickness of electrode 3.

The average thickness of the flat portion without being etched in the upper side of electrode 3 refers to a thickness in the vicinity of the portion of connection between the fillet and a non-etched surface. Variation in thickness is minor to such an extent as being inevitably caused in formation, and no intentional projections and recesses are provided.

For the purpose of improvement in contact between insulating film 2 and electrode 3, a stack structure can also be provided by forming an intermediate layer between insulating oxide film 2 and electrode 3 shown in FIG. 1. In this case, in the present embodiment, the intermediate layer is included in electrode 3. A material for the intermediate layer formed at an interface between insulating oxide film 2 and electrode 3 can be selected depending on the purpose of formation of the layer so long as the material does not affect formation of electrode 3. In forming an intermediate layer at the interface between insulating oxide film 2 and electrode 3 for the purpose of improvement in contact between insulating oxide film 2 and electrode 3, for example, titanium (Ti) is applicable as a material. The intermediate layer formed at the interface between insulating oxide film 2 and electrode 3 can have any thickness so long as formation of electrode 3 is not affected.

In forming a film of titanium (Ti) as the intermediate layer at the interface for the purpose of improvement in contact between insulating oxide film 2 and electrode 3, a thickness approximately from 10 nm to 50 nm of a formed film of titanium (Ti) is applicable. When the film is to function as a contact layer, the layer should be formed as a film over the entire interface. With a thickness not greater than 10 nm, the film cannot be formed over the entire interface, and a region partially without a contact layer may be formed. With a thickness not smaller than 10 nm, a function as a contact layer can be performed, however, a film thicker than necessary does not have to be formed. Too large a thickness causes increase in resistive component and affects characteristics of a semiconductor device. Therefore, an upper limit value should only be set as appropriate in accordance with a type of a semiconductor device, and a thickness can be set, for example, to 50 nm. Any number of intermediate layers can be formed between insulating oxide film 2 and electrode 3 so long as formation of electrode 3 is not affected.

A method of manufacturing a semiconductor device according to the first embodiment will now be described with reference to FIGS. 6 to 12.

Figure 6:
FIG. 6 is a cross-sectional view schematically showing a first step in a method of manufacturing a semiconductor device according to the first embodiment of the present invention.
Figure 7:
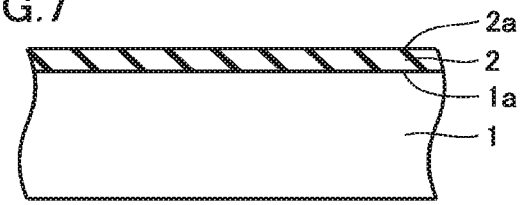
FIG. 7 is a cross-sectional view schematically showing a second step in the method of manufacturing a semiconductor device according to the first embodiment of the present invention.

FIGS. 6 to 12 are cross-sectional views for illustrating the method of manufacturing electrode 3 of the semiconductor device according to the first embodiment. Referring to FIG. 6, semiconductor substrate 1 including first surface 1a is prepared. Referring to FIG. 7, insulating film 2 is formed on first surface 1a of semiconductor substrate 1. Insulating film 2 is, for example, an insulating oxide film.

Figure 8:
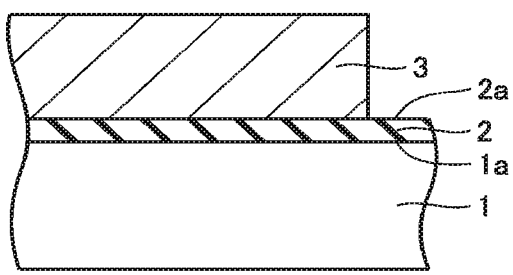
FIG. 8 is a cross-sectional view schematically showing a third step in the method of manufacturing a semiconductor device according to the first embodiment of the present invention.

Referring to FIG. 8, electrode 3 is formed on second surface 2a opposite to first surface 1a of insulating film 2. Electrode 3 is formed, for example, with chemical vapor deposition (CVD) or physical vapor deposition (PVD). Examples of CVD include plating. Plating includes two types which are electroless plating and electrolytic plating. Any formation method can be performed so long as formation of electrode 3 is not affected. Any step, technique, and formation condition as a detailed process in a plating process is applicable so long as aimed electrode 3 can be formed. Examples of PVD include sputtering. Examples of sputtering include magnetron sputtering, vapor deposition, and ion beam sputtering, and any sputtering method can be performed so long as aimed electrode 3 can be formed. Types of a power supply in sputtering include a direct current type and an alternating current type, and any sputtering method is applicable for formation so long as aimed electrode 3 can be formed.

Film formation conditions include such setting parameters as whether or not to perform heating, whether or not to perform assistive film formation, power to be supplied, and a numeric value for a flow rate, however, any film formation condition is applicable so long as aimed electrode 3 can be formed. When electrode 3 is formed with electrolytic plating, it is necessary to form a seed layer and to form a contact film as necessary. For example, CVD and PVD are applicable as methods of forming a seed layer and a contact layer, and any formation method may be employed so long as an aimed film can be formed. From a point of view of a construction of a device and a thickness necessary for forming a seed layer and a contact layer, sputtering is desirable for forming a seed layer and a contact layer.

Figure 9:
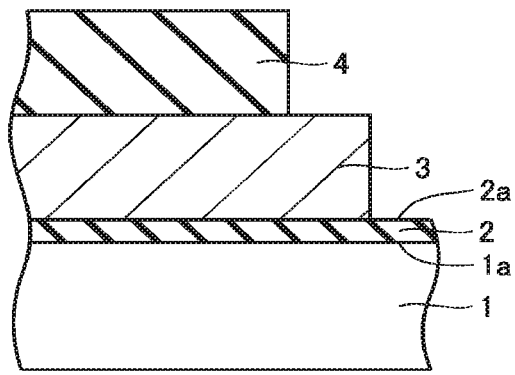
FIG. 9 is a cross-sectional view schematically showing a fourth step in the method of manufacturing a semiconductor device according to the first embodiment of the present invention.

Referring to FIG. 9, a pattern of a resist 4 is formed on electrode 3. Resist 4 used for forming a pattern includes, for example, a positive resist and a negative resist. Any type of resist can be used so long as formation of electrode 3 is not affected. Formation of a photoresist pattern on electrode 3 when a photoresist is used as a resist will be described. The photoresist is applied onto electrode 3 and the photoresist is uniformly spread over the entire surface of electrode 3 with a spin coater. A photomask is placed over semiconductor substrate 1 over which the resist has uniformly been spread as being wet, and irradiated with ultraviolet rays from an exposure apparatus. Thereafter, semiconductor substrate 1 with the resist irradiated with the ultraviolet rays is immersed in a developer to thereby remove the uncured resist. The photomask is in such a shape that a formed resist pattern is as large as the electrode or the photomask slightly opens only at the terminal portion of electrode 3.

Figure 10:
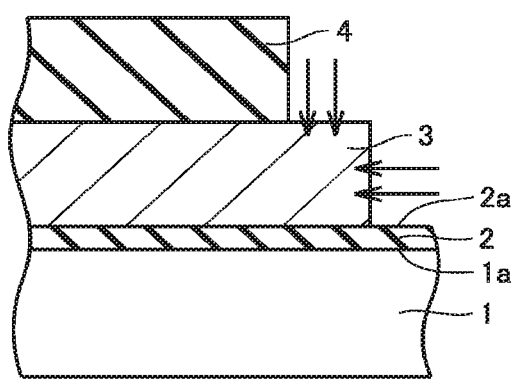
FIG. 10 is a cross-sectional view schematically showing a fifth step in the method of manufacturing a semiconductor device according to the first embodiment of the present invention.
Figure 11:
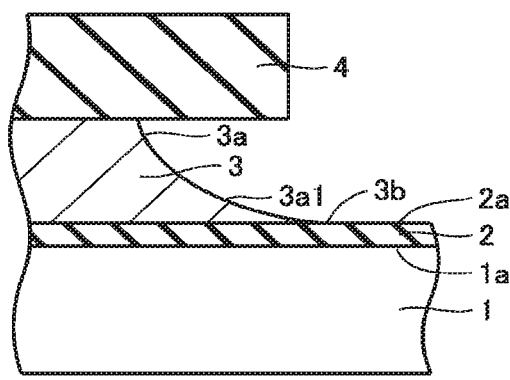
FIG. 11 is a cross-sectional view schematically showing a sixth step in the method of manufacturing a semiconductor device according to the first embodiment of the present invention.

Referring to FIGS. 10 and 11, electrode 3 is etched. By etching electrode 3, curved portion 3a1 curved as being recessed toward second surface 2a is formed in side surface 3a of electrode 3 such that a thickness of electrode 3 decreases toward edge 3b where side surface 3a is connected to second surface 2a.

Etching of electrode 3 includes isotropic etching and anisotropic etching. Any etching method is applicable so long as an aimed shape can be formed. In order to produce a structure closer to an aimed shape, isotropic etching is desirably used. The etching method includes dry etching and wet etching. Any method is applicable so long as an aimed shape of electrode 3 can be formed. In wet etching, any type of agent to be used for etching is applicable in any formation technique so long as an aimed shape of electrode 3 can be formed. In dry etching, any principle or any type of apparatus to be used for etching is applicable in any formation technique so long as an aimed shape of electrode 3 can be formed.

Figure 12:
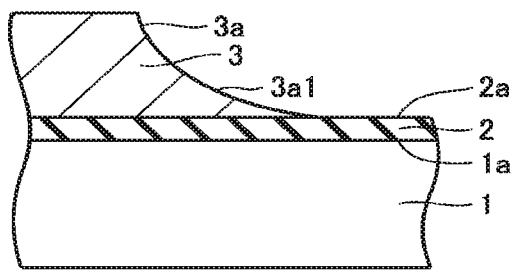
FIG. 12 is a cross-sectional view schematically showing a seventh step in the method of manufacturing a semiconductor device according to the first embodiment of the present invention.

Referring to FIG. 12, after electrode 3 is formed, resist 4 on electrode 3 is removed. For example, wet etching and dry etching represent a removal method. In order to remove resist 4 while the shape of electrode 3 formed in the previous step is maintained, a method of selectively removing only resist 4 with wet etching is desirable. Any etchant may be used for wet etching so long as resist 4 can be removed while the aimed shape of electrode 3 is maintained.

A function and effect of the present embodiment will now be described.

According to the semiconductor device in the present embodiment, the outer periphery of second face 3f of electrode 3 is formed on the inner side of the outer periphery of first face 3e. Therefore, stress at edge 3b which tends to be the starting point of break of the insulating film can be lowered. Since electrode 3 and insulating film 2 are connected to each other at a small angle, concentration of stress in insulating film 2 can be suppressed. Therefore, break of insulating film 2 due to stress generated at the interface between insulating film 2 and electrode 3 can be suppressed.

Since curved portion 3a1 is curved as being recessed toward second surface 2a, a thickness in curved portion 3a1 can be smaller than in an example in which side surface 3a of electrode 3 is linearly tapered. Therefore, concentration of stress in insulating film 2 can be suppressed as compared with the example in which side surface 3a of electrode 3 is linearly tapered.

Since electrode 3 decreases in thickness toward edge 3b, a thickness of electrode 3 can be secured in central portion 3c of electrode 3. Therefore, wire bonding capability of electrode 3 can be ensured.

According to the semiconductor device in the present embodiment, a distance in the direction along second surface 2a from a point where a thickness of side surface 3a from second surface 2a is ⅓ of a thickness thereof at central portion 3c to edge 3b is at least ten times as large as the thickness of side surface 3a at that point. A sufficient effect of lowering in stress is thus obtained.

According to the semiconductor device in the present embodiment, side surface 3a is constructed to be curved continuously from first face 3e to second face 3f. Therefore, stress at edge 3b is readily lowered while a thickness of electrode 3 is secured in central portion 3c of electrode 3.

According to the method of manufacturing a semiconductor device in the present embodiment, by etching electrode 3, curved portion 3a1 curved as being recessed toward second surface 2a is formed in side surface 3a of electrode 3 such that a thickness of electrode 3 is smaller toward edge 3b where side surface 3a is connected to second surface 2a. Therefore, curved portion 3a1 can be formed through etching without using a mask. Therefore, it is not necessary to fabricate or maintain a mask. Electrode 3 can be fabricated only with such a simplified method as etching. Therefore, the process can be simplified. A cycle time can be shortened. Furthermore, manufacturing costs can be reduced.

(Second Embodiment)

A feature the same as in the embodiment above has the same reference character allotted unless otherwise specified and description will not be repeated below. This is also applicable to a third embodiment.

Figure 13:
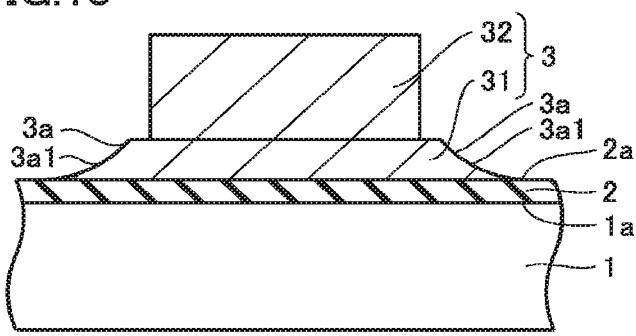
FIG. 13 is a cross-sectional view schematically showing a semiconductor device according to a second embodiment of the present invention.

FIG. 13 is a schematic diagram showing a shape of a semiconductor device according to a second embodiment. The semiconductor device according to the present invention includes semiconductor substrate 1, insulating film 2, and electrode 3 having a two-layered structure. Electrode 3 includes a first step portion 31 and a second step portion 32. First step portion 31 is provided on second surface 2a of insulating film 2. Side surface 3a of first step portion 31 includes curved portion 3a1. Second step portion 32 is stacked on first step portion 31 such that first step portion 31 lies between the second step portion and insulating film 2.

When viewed in a direction of stack of second step portion 32 on first step portion 31, second step portion 32 is smaller in area than first step portion 31. Specifically, second step portion 32 is a size smaller than first step portion 31.

Semiconductor substrate 1, insulating film 2, and electrode 3 identical in material, type, and thickness to semiconductor substrate 1, insulating film 2, and electrode 3 in the first embodiment, respectively, can be formed. Second step portion 32 may be similar in construction to electrode 3. An intermediate layer can also be formed between first step portion 31 and second step portion 32 for the purpose of improvement in contact. The intermediate layer may be similar in construction to the intermediate layer in the first embodiment.

A thickness of first step portion 31 is preferably at most ½ of a thickness of second step portion 32. When first step portion 31 has a thickness not greater than 10 μm, any dimension of the fillet shape formed at terminal portion 3d of first step portion 31 is applicable. When first step portion 31 has a thickness greater than 10 μm, the fillet shape formed at terminal portion 3d of first step portion 31 may be similar in dimension to the first embodiment.

A method of manufacturing a semiconductor device according to the second embodiment will now be described with reference to FIGS. 14 to 16.

Figure 14:
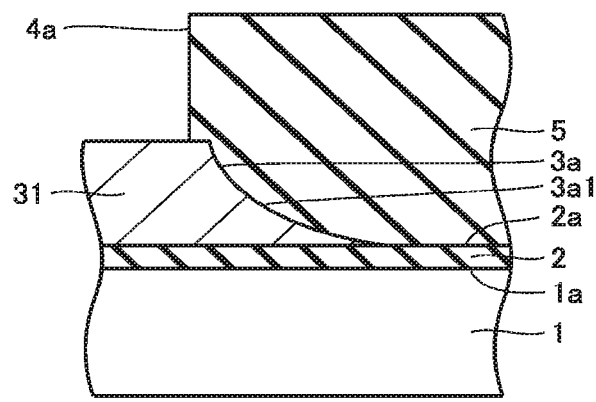
FIG. 14 is a cross-sectional view schematically showing a first step in a method of manufacturing a semiconductor device according to the second embodiment of the present invention.
Figure 15:
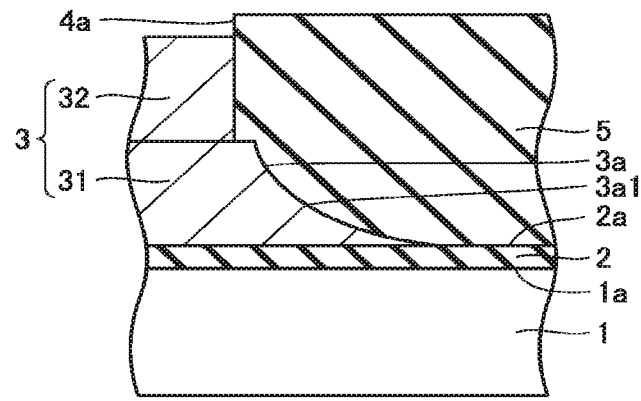
FIG. 15 is a cross-sectional view schematically showing a second step in the method of manufacturing a semiconductor device according to the second embodiment of the present invention.
Figure 16:
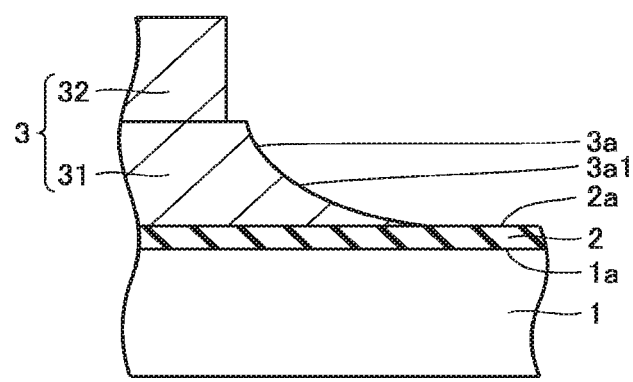
FIG. 16 is a cross-sectional view schematically showing a third step in the method of manufacturing a semiconductor device according to the second embodiment of the present invention.

FIGS. 14 to 16 are cross-sectional views for illustrating a method of manufacturing first step portion 31 and second step portion 32 of electrode 3 of the semiconductor device according to the second embodiment. For the sake of convenience of description, FIGS. 14 to 16 are different in scale from FIG. 13. The steps shown in FIGS. 6 to 12 in the first embodiment are the same also in the second embodiment. The second embodiment includes features shown in FIGS. 14 to 16 after the step shown in FIG. 12 in the first embodiment. Therefore, description starting from a step shown in FIG. 14 is given in the second embodiment.

Referring to FIG. 14, a pattern of a new resist 5 is formed on electrode 3. The pattern of resist 5 is formed on a flat portion in an upper surface of first step portion 31 so as to cover an outer peripheral portion including the fillet shape, with a central portion of first step portion 31 having the fillet shape formed in terminal portion 3d being left as an opening 4a. Any resist 4 in the first embodiment can be used for resist 5.

Referring to FIG. 15, second step portion 32 is formed on first step portion 31. Any of CVD and PVD in the first embodiment may be used as a method of forming second step portion 32. When second step portion 32 is formed through electrolytic plating, in order to make supply of charges to a plated surface more stable and uniform, a seed layer for forming second step portion 32 can also newly be formed on first step portion 31. Any of CVD and PVD in the first embodiment may be used as a method of forming a seed layer, however, sputtering is desirable. When a seed layer is formed on first step portion 31 in forming second step portion 32, in order to more clearly form the fillet shape at terminal portion 3d of first step portion 31, anisotropic etching by an amount comparable to a thickness of the seed layer is desirably performed.

A contact layer can also be formed as necessary. Sputtering is desirable as a method of forming a contact layer.

Referring to FIG. 16, after second step portion 32 is formed, resist 5 is removed.

A function and effect of the second embodiment will now be described.

According to the semiconductor device in the present embodiment, since first step portion 31 includes curved portion 3a1, curved portion 3a1 is readily fabricated. The fillet shape of a necessary dimension is readily fabricated. Therefore, fabrication of a semiconductor device can be simplified.

According to the semiconductor device in the present embodiment, a thickness of first step portion 31 is at most ½ of a thickness of second step portion 32. Therefore, by decreasing a thickness of first step portion 31 including curved portion 3a1, first step portion 31 is readily formed. Curved portion 3a1 of first step portion 31 can isotropically be etched under more general conditions and applications are wider.

(Third Embodiment)

Figure 17:
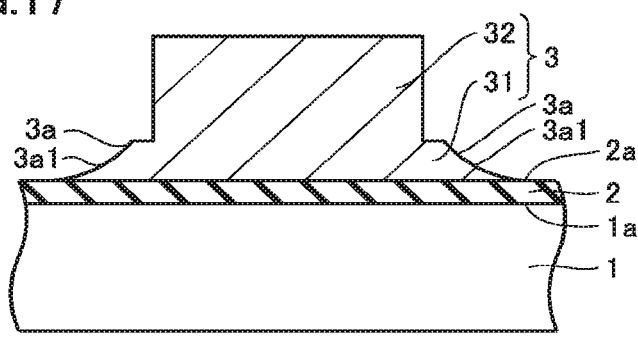
FIG. 17 is a cross-sectional view schematically showing a semiconductor device according to a third embodiment of the present invention.
Figure 18:
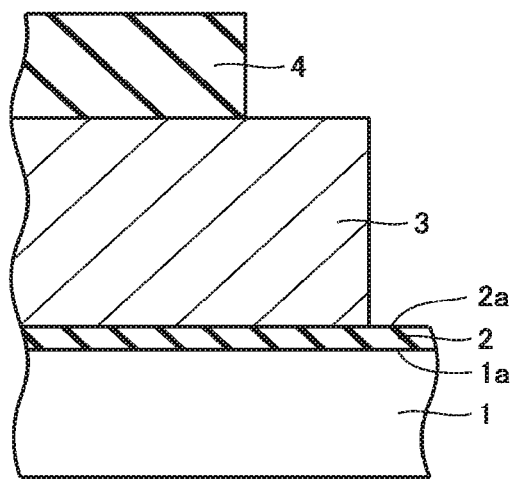
FIG. 18 is a cross-sectional view schematically showing a first step in a method of manufacturing a semiconductor device according to the third embodiment of the present invention.

FIG. 17 is a schematic diagram showing a shape of a semiconductor device according to a third embodiment. The semiconductor device according to the present invention includes semiconductor substrate 1, insulating film 2, and electrode 3 including an integrated projecting structure. Semiconductor substrate 1, insulating film 2, and electrode 3 can be formed with a material, a type, and a thickness being identical to those in the first embodiment. A ratio of thickness between first step portion 31 and second step portion 32 of electrode 3 and a dimension of the fillet shape corresponding thereto can be the same as in the second embodiment.

A method of manufacturing a semiconductor device according to the third embodiment will now be described with reference to FIGS. 18 to 23.

Figure 19:
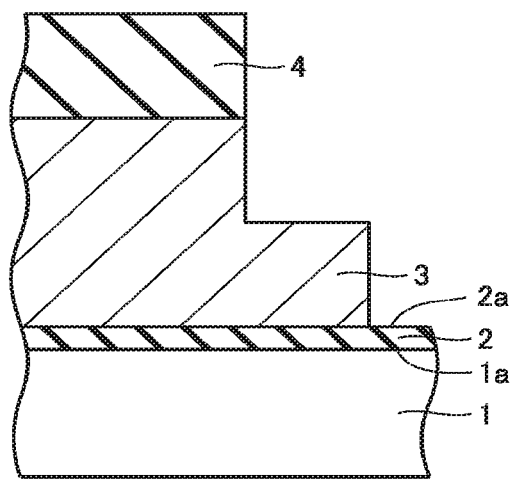
FIG. 19 is a cross-sectional view schematically showing a second step in the method of manufacturing a semiconductor device according to the third embodiment of the present invention.

FIGS. 18 to 23 are cross-sectional views for illustrating a method of manufacturing first step portion 31 and second step portion 32 of electrode 3 of the semiconductor device according to the third embodiment. For the sake of convenience of description, FIGS. 18 to 23 are different in scale from FIG. 17. The steps shown in FIGS. 6 to 9 in the first embodiment are the same also in the third embodiment. A step shown in FIG. 18 in the third embodiment corresponds to the step shown in FIG. 9 in the first embodiment. The third embodiment includes features shown in FIGS. 19 to 23 after the step shown in FIG. 18 corresponding to FIG. 9 in the first embodiment. Therefore, description starting from a step shown in FIG. 19 is given in the third embodiment.

Referring to FIG. 19, the outer peripheral portion of electrode 3 is formed in a projecting shape through etching. A stair structure of electrode 3 is thus fabricated. Any etching method is applicable so long as an aimed shape can be fabricated. In order to obtain an aimed shape, anisotropic etching is desirable.

Figure 20:
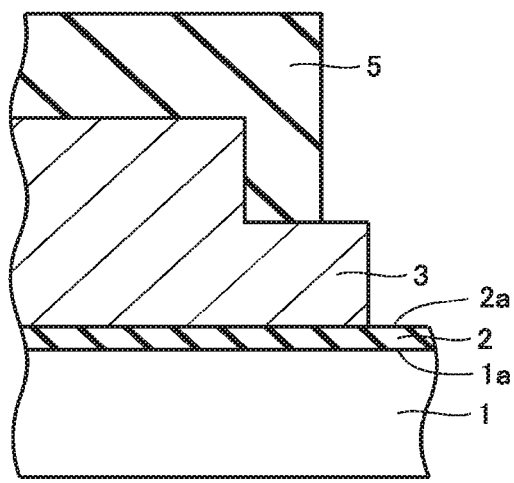
FIG. 20 is a cross-sectional view schematically showing a third step in the method of manufacturing a semiconductor device according to the third embodiment of the present invention.

Referring to FIG. 20, a pattern of resist 4 shown in FIG. 19 is removed. Thereafter, a pattern of resist 5 is newly formed on electrode 3. Resist 5 a size smaller than the size of electrode 3 is formed. A dimension of resist 5 is greater than initially formed resist 4 shown in FIG. 19, so that a part of the outer peripheral portion of electrode 3 which has decreased in thickness through anisotropic etching is also uniformly covered.

Figure 21:
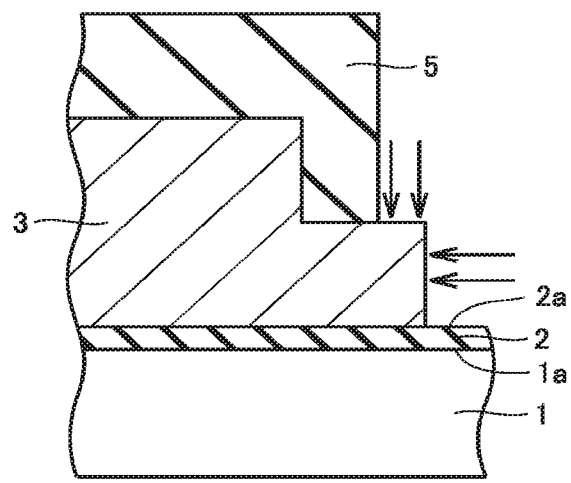
FIG. 21 is a cross-sectional view schematically showing a fourth step in the method of manufacturing a semiconductor device according to the third embodiment of the present invention.
Figure 22:
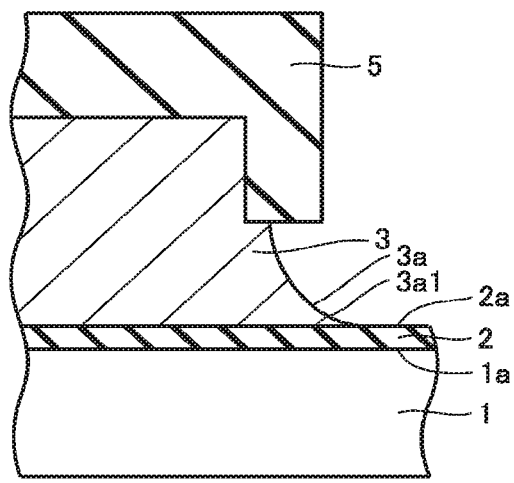
FIG. 22 is a cross-sectional view schematically showing a fifth step in the method of manufacturing a semiconductor device according to the third embodiment of the present invention.

Referring to FIGS. 21 and 22, curved portion 3a1 is formed in side surface 3a of first-step electrode 3 through isotropic etching.

Figure 23:
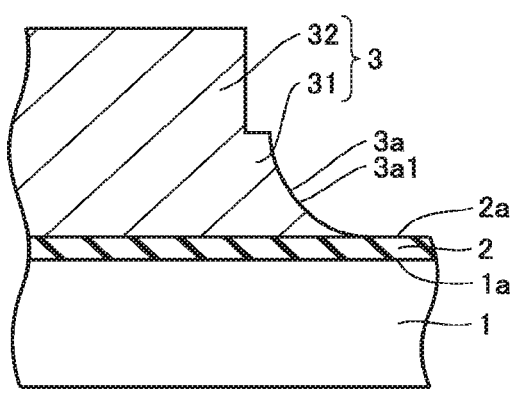
FIG. 23 is a cross-sectional view schematically showing a sixth step in the method of manufacturing a semiconductor device according to the third embodiment of the present invention.

Referring to FIG. 23, resist 5 is thereafter removed. First step portion 31 and second step portion 32 of electrode 3 are thus formed. No curved portion 3a1 is formed in side surface 3a of second step portion 32.

A function and effect of the third embodiment will now be described.

According to the semiconductor device in the present embodiment, electrode 3 in an integrated projecting shape is formed. By thus integrating electrode 3, a joint surface of electrode 3 can be reduced. Since the starting point of break can thus be reduced, reliability can be improved.

(Fourth Embodiment)

Figure 24:
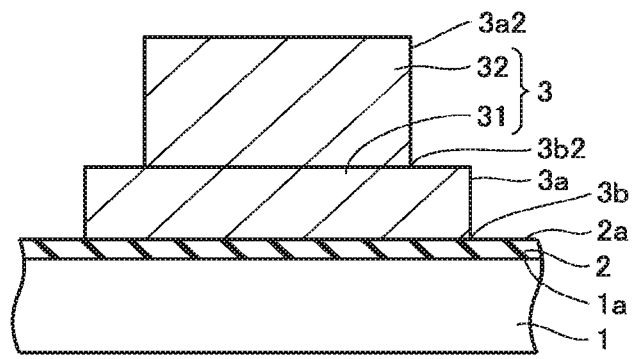
FIG. 24 is a cross-sectional view schematically showing a semiconductor device according to a fourth embodiment of the present invention.

FIG. 24 is a schematic diagram showing a shape of a semiconductor device according to a fourth embodiment. The semiconductor device according to the present invention includes semiconductor substrate 1, insulating film 2, and electrode 3 having a layered structure including two or more layers. Electrode 3 has a step structure including at least two steps, and has a separate structure in which each step is separate. Electrode 3 includes at least first step portion 31 and second step portion 32. First step portion 31 is provided on second surface 2a of insulating film 2. Side surface 3a of first step portion 31 does not necessarily have to include a curved portion and to be provided with a fillet. Second step portion 32 is stacked on first step portion 31 such that first step portion 31 lies between the second step portion and insulating film 2. When viewed in a direction of stack of second step portion 32 on first step portion 31, second step portion 32 is smaller in area than first step portion 31. Specifically, second step portion 32 is a size smaller than first step portion 31. A shape of an nth step subsequent to a third step portion is not designated.

Semiconductor substrate 1, insulating film 2, and electrode 3 can be formed with a material, a type, and a thickness being identical to those in the first and second embodiments.

First step portion 31 has a thickness preferably not greater than 20 μm. A point where a lower end 3b2 of a side surface portion 3a2 of second step portion 32 is in contact with the upper surface of first step portion 31 is desirably distant by at least 100 μm from an outer peripheral end of the upper surface of first step portion 31.

Figure 25:
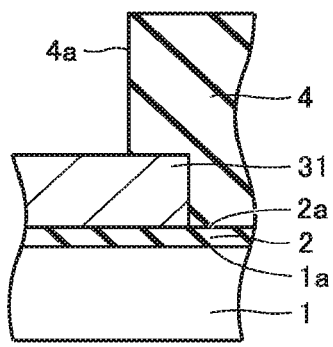
FIG. 25 is a cross-sectional view schematically showing a first step in a method of manufacturing a semiconductor device according to the fourth embodiment of the present invention.
Figure 26:
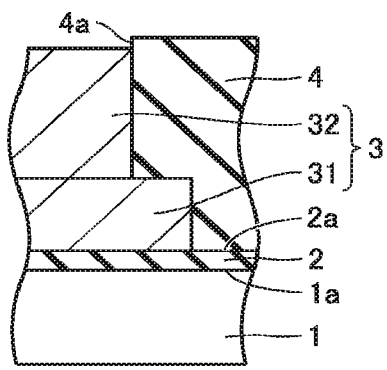
FIG. 26 is a cross-sectional view schematically showing a second step in the method of manufacturing a semiconductor device according to the fourth embodiment of the present invention.
Figure 27:
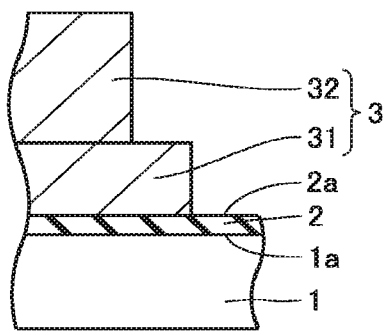
FIG. 27 is a cross-sectional view schematically showing a third step in the method of manufacturing a semiconductor device according to the fourth embodiment of the present invention.

A method of manufacturing a semiconductor device according to the fourth embodiment will now be described with reference to FIGS. 25 to 27. FIGS. 25 to 27 are cross-sectional views for illustrating a method of manufacturing first step portion 31 and second step portion 32 of electrode 3 of the semiconductor device according to the fourth embodiment. For the sake of convenience of description, FIGS. 25 to 27 are different in scale from FIG. 24. The steps shown in FIGS. 6 to 8 in the first embodiment are the same also in the fourth embodiment. The fourth embodiment includes features shown in FIGS. 25 to 27 after the step shown in FIG. 8 in the first embodiment. Therefore, description starting from the step shown in FIG. 25 is given in the fourth embodiment.

Referring to FIG. 25, a pattern of resist 4 is formed on electrode 3. The pattern of resist 4 is formed to cover the outer peripheral portion by at least 100 μm from the outer peripheral end (the right end in FIG. 25) of the upper surface of first step portion 31, with a central portion of first step portion 31 being left as opening 4a. Any resist 4 in the first embodiment can be used as resist 4.

Referring to FIG. 26, second step portion 32 is formed on first step portion 31. The formation method in the first and second embodiments is applicable as the method of forming second step portion 32.

A contact layer can also be formed as necessary. Sputtering is desirable as a method of forming a contact layer.

Referring to FIG. 27, after second step portion 32 is formed, resist 4 is removed.

Third and subsequent step portions can also be formed with a method the same as in FIGS. 25 to 27.

A function and effect of the fourth embodiment will now be described.

According to the semiconductor device in the present embodiment, it was confirmed in experiments that, by limiting a thickness of first step portion 31 and a region where second step portion 32 is to be formed, stress applied to insulating film 2 could be mitigated and stress in insulating film 2 could be suppressed without necessarily fabricating curved portion 3a1.

Specifically, a specimen of 10 mm×10 mm was employed, electrode 3 was constructed to include two steps for simplification, and first step portion 31 had a thickness of 10 μm and second step portion 32 had a thickness of 20 μm. A point where lower end 3b2 of side surface portion 3a2 of second step portion 32 was in contact with the upper surface of first step portion 31 was at a distance of 100 μm from the outer peripheral end of the upper surface of first step portion 31. After a temperature in experiments was held for one hour at 350° C. in vacuum from a room temperature, the temperature in experiments was again set to the room temperature. A vacuum heat treatment furnace was employed as a heat treatment apparatus.

Consequently, it was found that no crack was observed in insulating film 2 directly under end portion (edge) 3b of first step portion 31 and the effect of lowering in stress applied to insulating film 2 directly under end portion (edge) 3b of first step portion 31 was achieved. It was found that, by employing the structure in the fourth embodiment, an effect the same as in formation of the fillet shape was obtained without necessarily requiring formation of the fillet shape. Since it is not necessary to provide a fillet, formation with a more general technique can be done and applications are wider.

(Fifth Embodiment)

Figure 28:
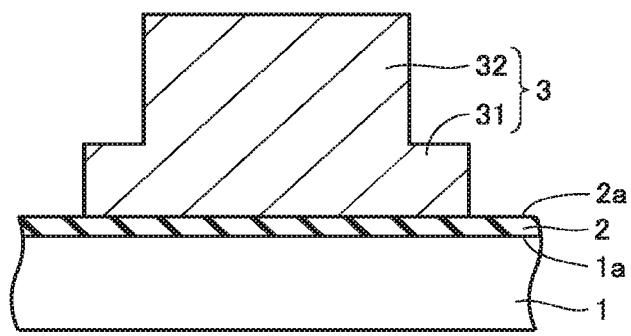
FIG. 28 is a cross-sectional view schematically showing a semiconductor device according to a fifth embodiment of the present invention.

FIG. 28 is a schematic diagram showing a shape of a semiconductor device according to a fifth embodiment. The semiconductor device according to the present invention includes semiconductor substrate 1, insulating film 2, and electrode 3 including an integrated projecting structure. Electrode 3 includes a step structure including at least two steps and has an integrated structure in which steps are continuous to each other. Semiconductor substrate 1, insulating film 2, and electrode 3 can be formed with a material, a type, and a thickness being identical to those in the first embodiment. A fillet does not have to formed in the side surface of the first step portion. A ratio of thickness between first step portion 31 and second step portion 32 of electrode 3 and a dimension of a position of connection between the surface of the first step portion and an end portion of the second step portion corresponding thereto can be identical to those in the fourth embodiment.

Figure 29:
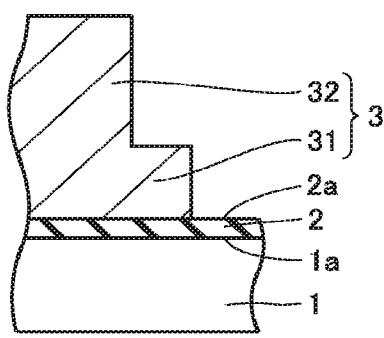
FIG. 29 is a cross-sectional view schematically showing a first step in a method of manufacturing a semiconductor device according to the fifth embodiment of the present invention.

A method of manufacturing a semiconductor device according to a fifth embodiment will now be described with reference to FIG. 29. FIG. 29 is a cross-sectional view for illustrating a method of manufacturing first step portion 31 and second step portion 32 of electrode 3 of the semiconductor device according to the fifth embodiment. For the sake of convenience of description, FIG. 29 is different in scale from FIG. 28. The steps shown in FIGS. 6 to 8 in the first embodiment are the same also in the fifth embodiment. The step shown in FIG. 19 in the third embodiment performed subsequent to the step shown in FIG. 18 in the third embodiment corresponding to the step shown in FIG. 9 in the first embodiment is also the same in the fifth embodiment. The fifth embodiment includes features shown in FIG. 29 after the step shown in FIG. 19 in the third embodiment. Therefore, only a step shown in FIG. 29 is described in the fifth embodiment. Referring to FIG. 29, a pattern of resist 4 shown in FIG. 19 is removed.

A function and effect of the fourth embodiment will now be described.

According to the semiconductor device in the present embodiment, electrode 3 in an integrated projecting shape is formed. By thus integrating electrode 3, a joint surface of electrode 3 can be reduced. Since the starting point of break can thus be reduced, reliability can be improved.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

REFERENCE SIGNS LIST

1 semiconductor substrate; 1*a* first surface; 2 insulating film; 2*a* second surface; 3 electrode; 3*a* side surface; 3*a*1 curved portion; 3*b* edge; 3*b*2 edge of second step portion (lower end of side surface portion of second step portion); 3*c* central portion; 3*d* terminal portion; 3*e* first face; 3*f* second face; 31 first step portion; and 32 second step portion

The invention claimed is:

1. A semiconductor device comprising:
   a semiconductor substrate including a first surface;
   an insulating film provided on the first surface of the semiconductor substrate and including a second surface opposite to the first surface; and
   a Cu electrode connected to the second surface of the insulating film and including a side surface, a first face in contact with the insulating film, and a second face opposite to the first face,
   an outer periphery of the second face of the Cu electrode being formed on an inner side of an outer periphery of the first face,
   the Cu electrode having a thickness not smaller than 5 μm and not greater than 10 μm,
   the side surface of the Cu electrode including a curved portion curved as being recessed toward the second surface in such a manner that a thickness of the Cu electrode decreases toward an edge where the side surface is connected to the second surface and in such a sloped manner that an angle formed between the side surface and the second surface is smaller, and
   the Cu electrode including a central portion surrounded by the side surface, and a distance in a direction along the second surface from a point where a thickness of the side surface from the second surface is ⅓ of a thickness of the side surface at the central portion to the edge being at least ten times as large as the thickness of the side surface at the point.

2. The semiconductor device according to claim 1, wherein
   the side surface is constructed to be curved continuously from the first face to the second face.

3. The semiconductor device according to claim 1, wherein
   the Cu electrode includes a step structure including at least two steps including a first step portion provided on the second surface of the insulating film and including the curved portion and a second step portion stacked on the first step portion such that the first step portion lies between the second step portion and the insulating film.

4. The semiconductor device according to claim 3, wherein
   a thickness of the first step portion is at most ½ of a thickness of the second step portion.

5. A method of manufacturing a semiconductor device comprising:
   preparing a semiconductor substrate including a first surface;
   forming an insulating film on the first surface of the semiconductor substrate;
   forming a Cu electrode having a thickness not smaller than 5 μm and not greater than 10 μm on a second surface opposite to the first surface of the insulating film; and
   forming a curved portion in a side surface of the Cu electrode by etching the Cu electrode, the curved portion being curved as being recessed toward the second surface in such a manner that a thickness of the Cu electrode decreases toward an edge where the side surface is connected to the second surface and in such a sloped manner that an angle formed between the side surface and the second surface is smaller,
   the Cu electrode having the curved portion formed including a central portion surrounded by the side surface, and a distance in a direction along the second surface from a point where a thickness of the side surface from the second surface is ⅓ of a thickness of the side surface at the central portion to the edge being at least ten times as large as the thickness of the side surface at the point.

6. The method of manufacturing a semiconductor device according to claim 5, wherein
   the etching is isotropic etching.

7. The method of manufacturing a semiconductor device according to claim 6, wherein
   the isotropic etching is at least any of dry etching and wet etching.

8. The semiconductor device according to claim 2, wherein
   the Cu electrode includes a step structure including at least two steps including a first step portion provided on the second surface of the insulating film and including the curved portion and a second step portion stacked on the first step portion such that the first step portion lies between the second step portion and the insulating film.

9. The semiconductor device according to claim 8, wherein a thickness of the first step portion is at most ½ of a thickness of the second step portion.

\* \* \* \* \*